(12) United States Patent
Yan et al.

(10) Patent No.: US 12,141,408 B2
(45) Date of Patent: *Nov. 12, 2024

(54) TOUCH SUBSTRATE AND TOUCH DISPLAY DEVICE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Jun Yan, Beijing (CN); Xiangdan Dong, Beijing (CN); Lingran Wang, Beijing (CN); Bo Cheng, Beijing (CN); Fan He, Beijing (CN); Mengmeng Du, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

This patent is subject to a terminal disclaimer.

(21) Appl. No.: 18/456,372

(22) Filed: Aug. 25, 2023

(65) Prior Publication Data

US 2023/0400952 A1  Dec. 14, 2023

Related U.S. Application Data

(63) Continuation of application No. 16/975,443, filed as application No. PCT/CN2019/114043 on Oct. 29, 2019, now Pat. No. 11,797,137.

(51) Int. Cl.
 *G06F 3/044* (2006.01)
 *G06F 3/041* (2006.01)
 *H10K 59/40* (2023.01)

(52) U.S. Cl.
 CPC .......... *G06F 3/0446* (2019.05); *G06F 3/0412* (2013.01); *G06F 3/04164* (2019.05); *G06F 2203/04111* (2013.01); *H10K 59/40* (2023.02)

(58) Field of Classification Search
 CPC ............ H10K 59/40; G06F 3/041–047; G06F 2203/041–04114
 See application file for complete search history.

(56) References Cited

U.S. PATENT DOCUMENTS

2014/0218630 A1  8/2014 Kang
2017/0123572 A1  5/2017 Song et al.
(Continued)

FOREIGN PATENT DOCUMENTS

CN  208110574 U  11/2018
CN  109002208 A  12/2018
(Continued)

OTHER PUBLICATIONS

International Search Report and Written Opinion dated Jul. 15, 2020 received in International Application No. PCT/CN2019/114043.
(Continued)

*Primary Examiner* — Sanjiv D. Patel
(74) *Attorney, Agent, or Firm* — Scully, Scott, Murphy & Presser, P.C.

(57) ABSTRACT

A touch substrate and a touch display device are provided. The touch substrate includes a touch region and a notch region, a first notch touch electrode extending to the notch region, the touch substrate further includes a touch-driving connection line connected to the first notch touch electrode, the plurality of second touch electrodes includes at least one second disconnection touch electrode, each of the at least one second disconnection touch electrode includes a first sub portion and a second sub portion, the touch substrate further includes a bridge line and a shielding line, the bridge line
(Continued)

connects the first sub portion and the second sub portion, an orthographic projection of at least a part of the shielding line on the base substrate is between an orthographic projection of the bridge line on the base substrate and an orthographic projection of the touch-driving connection line on the base substrate.

19 Claims, 5 Drawing Sheets

(56) References Cited

U.S. PATENT DOCUMENTS

| | | |
|---|---|---|
| 2019/0179441 A1 | 6/2019 | Moon |
| 2019/0265808 A1 | 8/2019 | Zhang et al. |
| 2020/0117313 A1 | 4/2020 | Zhang et al. |

FOREIGN PATENT DOCUMENTS

| | | | | |
|---|---|---|---|---|
| CN | 109885200 A | * | 6/2019 | |
| CN | 110244873 A | * | 9/2019 | ........... G06F 3/0412 |
| CN | 110308811 A | | 10/2019 | |

OTHER PUBLICATIONS

Office Action dated Dec. 22, 2022 received in U.S. Appl. No. 16/975,443.
Office Action dated Apr. 5, 2023 received in U.S. Appl. No. 16/975,443.
Notice of Allowance dated Jun. 22, 2023 received in U.S. Appl. No. 16/975,443.

* cited by examiner

200

TOUCH SUBSTRATE AND TOUCH DISPLAY DEVICE

The present application is a continuation of U.S. Ser. No. 16/975,443 filed on Aug. 25, 2020, which is a national stage application of PCT international patent application PCT/CN2019/114043 filed on Oct. 29, 2019, the content of which is incorporated in its entirety as portion of the present application by reference herein

TECHNICAL FIELD

Embodiments of the present disclosure relate to a touch substrate and a touch display device.

BACKGROUND

With the continuous development of touch technology, smart electronic products such as mobile phones, tablet computers and the like are integrated with touch substrates having touch functions. On the other hand, with the development of the market, the smart electronic products such as mobile phones, tablet computers and the like gradually adopt narrow frame or even no frame designs, that is, "full screen" design, so as to provide better experiences for users.

SUMMARY

Embodiments of the present disclosure provide a touch substrate and a touch display device. The touch substrate can electrically connect a first sub portion and a second sub portion, which are disconnected in a notch region, of a second disconnection touch electrode by providing a bridge line; at another aspect, the touch substrate can prevent signal interference between the bridge line and a touch-driving connection line by providing a shielding line between the bridge line and a touch-driving connection line, so as to avoid affecting the touch performance.

At least one embodiment of the present disclosure provides a touch substrate, which includes: a base substrate; a plurality of first touch electrodes arranged along a first direction on the base substrate; and a plurality of second touch electrodes arranged along a second direction on the base substrate, the touch substrate includes a touch region and a notch region at an edge portion of the touch region in the second direction, the plurality of first touch electrodes include at least one first notch touch electrode extending to the notch region, the touch substrate further includes a touch-driving connection line connected to each of the at least one first notch touch electrode, and the plurality of second touch electrodes include at least one second disconnection touch electrode disconnected at the notch region, each of the at least one second disconnection touch electrode includes a first sub portion and a second sub portion respectively on two sides of the notch region, the touch substrate further includes a bridge line, the bridge line at least partially extends along an edge of the notch region close to the touch region and connects the first sub portion with the second sub portion, at least one touch-driving connection line extends along the edge of the notch region close to the touch region and extends to an edge of the notch region away from the touch region, and the touch substrate further includes a shielding line, and an orthographic projection of at least a part of the shielding line on the base substrate is between an orthographic projection of the bridge line on the base substrate and an orthographic projection of the touch-driving connection line on the base substrate.

For example, in the touch substrate provided by an embodiment of the present disclosure, the bridge line includes a bridge main portion and first U-shaped bent portions respectively at two ends of the bridge main portion, and each of the first U-shaped bent portions is electrically connected to the first sub portion or the second sub portion, and each of the first U-shaped bent portions includes a first bent portion extending substantially along the second direction, a second bent portion extending substantially along the second direction, and a first connection portion extending substantially along the first direction and connecting the first bent portion with the second bent portion.

For example, in the touch substrate provided by an embodiment of the present disclosure, an orthographic projection of the first bent portion on the base substrate at least partially overlaps with an orthographic projection of the first sub portion on the base substrate or an orthographic projection of the second sub portion on the base substrate.

For example, in the touch substrate provided by an embodiment of the present disclosure, two first U-shaped bent portions at two ends of the bridge line are axially symmetric with respect to a perpendicular bisector of the bridge line.

For example, in the touch substrate provided by an embodiment of the present disclosure, the bridge main portion includes two portions respectively in a first conductive layer and a second conductive layer and electrically connected with each other.

For example, in the touch substrate provided by an embodiment of the present disclosure, the shielding line includes a shielding main portion and second U-shaped bent portions respectively at two ends of the shielding main portion, and each of the second U-shaped bent portions includes a third bent portion extending substantially along the second direction, a fourth bent portion extending substantially along the second direction, and a second connection portion extending substantially along the first direction and connecting the third bent portion with the fourth bent portion, and each of the second U-shaped bent portions is in a region enclosed by the first bent portion, the second bent portion and the first connection portion, the first connection portion is substantially parallel to the second connection portion, and an opening direction of the second U-shaped bent portion is identical to an opening direction of the first U-shaped bent portion.

For example, in the touch substrate provided by an embodiment of the present disclosure, in a region enclosed by the first U-shaped bent portion, an orthographic projection of the touch-driving connection line on the base substrate is between an orthographic projection of the third bent portion on the base substrate and an orthographic projections of the fourth bent portion on the base substrate, and overlaps with orthographic projections of the first connection portion and the second connection portion on the base substrate.

For example, in the touch substrate provided by an embodiment of the present disclosure, the touch-driving connection line includes a first sub touch-driving connection line on a side of the second connection portion away from the first connection portion and a second sub touch-driving connection line on a side of the first connection portion away from the second connection portion, and the touch substrate further includes a bridge portion connecting the first sub touch-driving connection line with the second sub touch-driving connection line.

For example, in the touch substrate provided by an embodiment of the present disclosure, the shielding line further includes: a L-shaped bent portion, on a side of the first connection portion away from the second connection portion, wherein the L-shaped bent portion includes a first extension portion extending substantially along the first direction and a second extension portion connected with the first extension portion and extending substantially along the second direction, the first extension portion is between the first connection portion and the second sub touch-driving connection line, and the second extension portion is substantially parallel to the second sub touch-driving connection line.

For example, in the touch substrate provided by an embodiment of the present disclosure, the bridge portion includes: a third connection portion, in a different layer from the first connection portion, the first sub touch-driving connection line and the second sub touch-driving connection line; a first through-hole connection portion, connecting the third connection portion with the first sub touch-driving connection line; and a second through-hole connection portion, connecting the third connection portion with the second sub touch-driving connection line, the third connection portion is in the first conductive layer, the first sub touch-driving connection line and the second sub touch-driving connection line are in the second conductive layer, an insulating layer is provided between the first conductive layer and the second conductive layer, and the first through-hole connection portion and the second through-hole connection portion are in the insulating layer, an orthographic projection of the third connection portion on the base substrate overlaps with an orthographic projection of the first sub touch-driving connection line on the base substrate and an orthographic projection of the second sub touch-driving connection line on the base substrate, respectively.

For example, in the touch substrate provided by an embodiment of the present disclosure, the shielding line further includes: a fourth connection portion, in a same layer as the third connection portion; a third through-hole connection portion, connecting the fourth connection portion with the fourth bent portion; and a fourth through-hole connection portion, connecting the fourth connection portion with the second extension portion, the fourth connection portion is in the first conductive layer, the third bent portion, the second connection portion, the fourth bent portion, the first extension and the second extension portion are in the second conductive layer, and the third through-hole connection portion and the fourth through-hole connection portion are in the insulating layer, and an orthographic projection of the fourth connection portion on the base substrate overlaps with an orthographic projection of the fourth bent portion on the base substrate and an orthographic projection of the second extension portion on the base substrate, respectively.

For example, in the touch substrate provided by an embodiment of the present disclosure, a center of the first through-hole connection portion and a center of the third through-hole connection portion are staggered in the second direction.

For example, in the touch substrate provided by an embodiment of the present disclosure, the first bent portion, the second bent portion and the first connection portion are in the second conductive layer.

For example, the touch substrate provided by an embodiment of the present disclosure further includes a grounded line, on a side of the bridge line away from the touch region.

For example, in the touch substrate provided by an embodiment of the present disclosure, the base substrate is a cover plate of a display panel or an encapsulation layer of a display panel.

For example, in the touch substrate provided by an embodiment of the present disclosure, the first touch electrode is a touch-driving electrode, and the second touch electrode is a touch-sensing electrode.

At least one embodiment of the present disclosure provides a touch display device, including any one of the abovementioned touch substrates.

For example, in the touch display device provided by an embodiment of the present disclosure, the notch region is provided with one or more selected from the group consisting of a camera, a speaker and an infrared sensor.

BRIEF DESCRIPTION OF THE DRAWINGS

In order to clearly illustrate the technical solution of the embodiments of the present disclosure, the drawings of the embodiments will be briefly described in the following. It is obvious that the described drawings in the following are only related to some embodiments of the present disclosure and thus are not limitative of the present disclosure.

DETAILED DESCRIPTION

Figure 1:
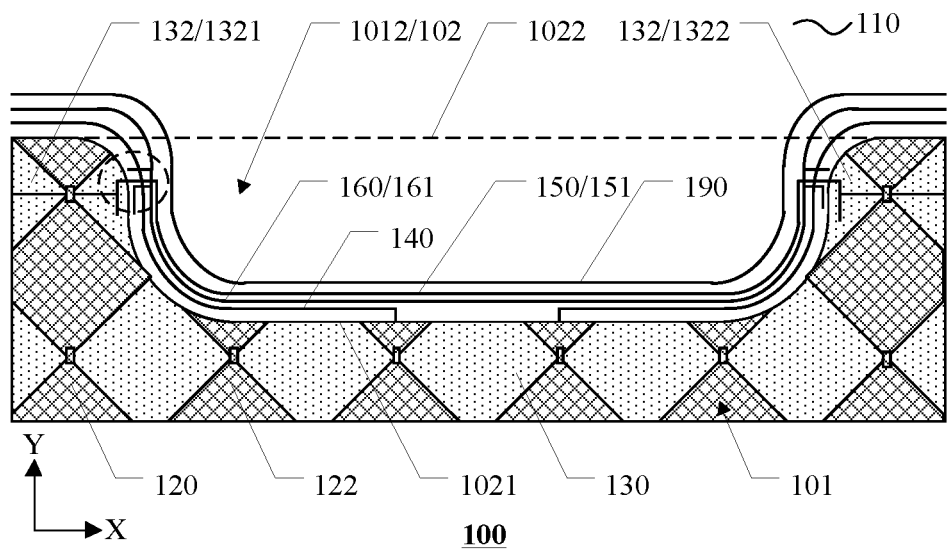
FIG. 1 is a planar diagram of a touch substrate provided by an embodiment of the present disclosure.

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various components. Also, the terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", "coupled", etc., are not intended to define a physical connection or mechanical connection, but may include an electrical connection, directly or indirectly.

At present, in order to retain the front camera and other sensors while increasing the screen ratio, a notch design is required on the upper edge of the touch substrate. In this case, because the upper edge of the touch substrate adopts a notch design and is formed with a notch region, touch electrode patterns are disconnected at the above notch region, and a special design is required to connect the touch electrodes on two sides of the notch region, and lead lines of the touch electrodes are required to be arranged reasonably.

On the other hand, the touch substrate usually adopts a rounded corner design, and touch-sensing electrodes will be cut at the position of the rounded corner. As a result, the touch electrode at the position of the rounded corner needs to be connected to the corresponding touch electrode connection line by a jumper line design.

In this regard, embodiments of the present disclosure provide a touch substrate and a touch display device. The touch substrate includes: a base substrate, a plurality of first touch electrodes arranged along a first direction on the base substrate; and a plurality of second touch electrodes arranged along a second direction on the base substrate. The touch substrate includes a touch region and a notch region at an edge portion of the touch region in the second direction, the plurality of first touch electrodes include at least one first notch touch electrode extending to the notch region, the touch substrate further includes a touch-driving connection line connected to each of the at least one first notch touch electrode, and the plurality of second touch electrodes include at least one second disconnection touch electrode disconnected at the notch region, each of the at least one second disconnection touch electrode comprises a first sub portion and a second sub portion respectively on two sides of the notch region, the touch substrate further includes a bridge line, the bridge line at least partially extends along an edge of the notch region close to the touch region and connects the first sub portion with the second sub portion, at least one touch-driving connection line extends along the edge of the notch region close to the touch region and extends to an edge of the notch region away from the touch region, and the touch substrate further includes a shielding line, and an orthographic projection of at least a part of the shielding line on the base substrate is between an orthographic projection of the bridge line on the base substrate and an orthographic projection of the touch-driving connection line on the base substrate. The touch substrate can electrically connect the first sub portion with the second sub portion of the second disconnection touch electrode that are disconnected at the notch region by providing the above bridge line; on the other hand, the touch substrate can prevent signal interference between the bridge line and the touch-driving connection line by providing the shielding line between the bridge line and the touch-driving connection line, so as to avoid affecting the touch performance.

On the other hand, embodiments of the present disclosure further provide a touch substrate and a touch display device. The touch substrate includes a base substrate, a plurality of first touch electrodes arranged along a first direction on the base substrate; and a plurality of second touch electrodes arranged along a second direction on the base substrate. The touch substrate includes a touch region and a peripheral region at the periphery of the touch region, the touch region includes a rounded corner region, and the plurality of first touch electrodes include at least one first rounded corner touch electrode extending to the rounded corner region. The touch substrate further includes a touch-driving connection line connected to each of the at least one first rounded corner touch electrode. The plurality of second touch electrodes include at least one second rounded corner touch electrode extending to the rounded corner region, and the touch substrate further includes a touch-sensing connection line connected to each of the at least one second rounded corner touch electrode. The touch-sensing connection line includes a first U-shaped bent portion and a first extension portion extending along the second direction, and the first U-shaped bent portion includes a first bent portion connected to the second rounded corner touch electrode and on a side of the touch-driving connection line close to the touch region, a second bent portion connected to the first extension portion and on a side of the touch-driving connection line away from the touch region, and a first connection portion connecting the first bent portion with the second bent portion. The first connection portion and the touch-driving connection line are overlapped with each other in a direction perpendicular to the base substrate, and in an overlapping region of first connection portion and the touch-driving connection line, the first connection portion and the touch-driving connection line are arranged in different layers. Therefore, the touch substrate adopts a jumper line design at the rounded corner region to connect the second rounded corner touch electrode extending to the rounded corner region with the first extension portion of the corresponding touch-sensing connection line.

Hereinafter, the touch substrate and the touch display device provided by the embodiments of the present disclosure will be described in detail with reference to the accompanying drawings.

Figure 2:
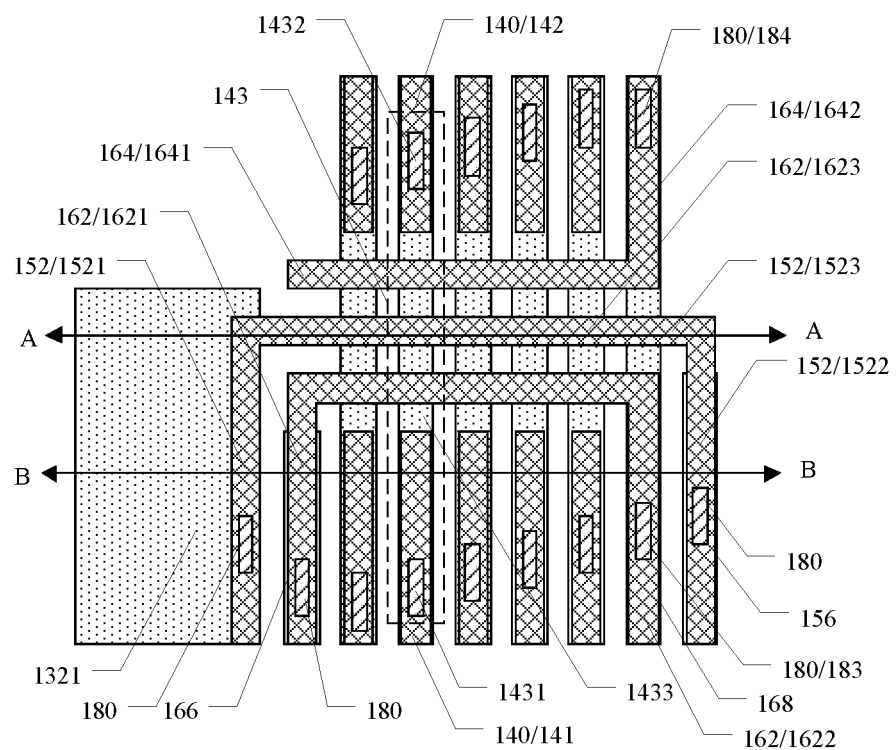
FIG. 2 is an enlarged diagram of a touch substrate provided by an embodiment of the present disclosure in a dashed frame in FIG. 1.

FIG. 1 is a planar diagram of a touch substrate provided by an embodiment of the present disclosure; and FIG. 2 is an enlarged diagram of a touch substrate provided by an embodiment of the present disclosure at the position of the dashed frame in FIG. 1. As shown in FIG. 1 and FIG. 2, the touch substrate 100 includes a base substrate 110 and a plurality of first touch electrodes 120 and a plurality of second touch electrodes 130 on the base substrate 110. The plurality of first touch electrodes 120 are arranged along a first direction X; and the plurality of second touch electrodes 130 are arranged along a second direction Y The touch substrate 100 includes a touch region 101 and a notch region 102 at an edge portion 1012 of the touch region 101 in the second direction Y, the plurality of first touch electrodes 120 include at least one first notch touch electrode 122 extending to the notch region 102, and the touch substrate 100 further includes a touch-driving connection line 140 connected to each first notch touch electrode 122. It should be noted that the first notch touch electrode 122 refers to the first touch electrode 120 that extends from the touch region 101 to the notch region 102 in the second direction; for simplicity, FIG. 1 shows only two touch electrode drive connection lines, each first notch touch electrode of the touch substrate provided by the embodiments of the present disclosure may be connected to one touch-driving connection line. It should be noted that each first touch electrode is a touch electrode extending along the second direction, and the plurality of first touch electrodes are arranged along the first direction; each second touch electrode is a touch electrode extending along the first direction, and the plurality of second touch electrodes are arranged along the second direction. In addition, the above first direction and the second direction are two directions in a plane where the touch substrate is located and intersecting each other, for example, perpendicular to each other.

As shown in FIG. 1 and FIG. 2, the plurality of second touch electrodes 130 include at least one second disconnection touch electrode 132 that is disconnected at the notch region 102, and each second disconnection touch electrode 132 includes a first sub portion 1321 and a second sub portion 1322 respectively on two sides of the notch region 102. The touch substrate 100 further includes a bridge line 150, which at least partially extends along the edge 1021 of the notch region 102 close to the touch region 101 and connects the first sub portion 1321 with the second sub portion 1322, at least one touch-driving connection line 140 extends along the edge 1021 of the notch region 102 close to the touch region 101 and extends to the edge 1022 of the notch region 102 away from the touch region 101. The touch substrate 100 further includes a shielding line 160, an orthographic projection of at least a part of the shielding line 160 on the base substrate 110 is between an orthographic projection of the bridge line 150 on the base substrate 110 and an orthographic projection of the touch-driving connection line 140 on the base substrate 110. It should be noted that the above first touch electrode may be a touch-driving electrode, and the above second touch electrode may be a touch-sensing electrode; of course, the embodiments of the present disclosure include, but are not limited to this case, the above first touch electrode may also be a touch-sensing electrode, and the second touch electrode may also be a touch-driving electrode.

It should be noted that, the touch-driving connection line and the bridge line are adjacent to each other, and a TX signal on the touch-driving connection line and a RX signal on the bridge line have a potential difference. Due to the existence of coupling capacitance, the problem of the TX signal charge escape will be caused, and then the signal-to-noise ratio will be reduced. In the present disclosure, the shielding line (guard line) is provided between the touch-driving connection line and the bridge line, and the shielding line can be applied with a guard signal, the guard signal is an AC signal (square wave), which is the same as the TX signal applied to the touch-driving connection line. In this way, the potential difference between TX signal and guard signal is always 0, so the signal-to-noise ratio is prevented from being reduced due to charge escape distortion, which plays a role in shielding interference and improving the signal-to-noise ratio.

The touch substrate can electrically connect the first sub portion with the second sub portion of the second disconnection touch electrode that are disconnected at the notch region by providing the above bridge line; on the other hand, the touch substrate can prevent signal interference between the bridge line and the touch-driving connection line by providing the shielding line between the bridge line and the touch-driving connection line, so as to avoid affecting the touch performance.

In some examples, as shown in FIG. 1, because three sides of the notch region are surrounded by the touch region, the edge 1021 of the touch region 101 close to the notch region 102 is located at the three sides of the notch region 102 surrounded by the touch region 101, that is, the notch region 102 is surrounded only by the edge 1021 of the notch region 102 close to the touch region 101 and the edge 1022 of the notch region 102 away from the touch region 101.

For example, as shown in FIG. 1, the touch region 101 and the notch region 102 of the touch substrate 100 may constitute a rectangular region. For example, as shown in FIG. 1, the shape of the notch region 102 may be a rounded rectangle with two rounded corners close to the touch region 101.

For example, as shown in FIG. 1, the first touch electrode 120 and the second touch electrode 130 may be made of the same conductive layer. For example, the second touch electrode 130 may be a continuous electrode extending along the first direction, and the first touch electrode 120 may include a plurality of block electrodes separated by the second touch electrode 130 and a plurality of electrode bridge structure electrically connecting the plurality of block electrodes. Of course, the embodiments of the present disclosure include but are not limited thereto, and the layout of the first touch electrode and the second touch electrode can refer to the conventional design.

For example, the first touch electrode 120 and the second touch electrode 130 may be made of a metal material, or a conductive metal oxide such as indium tin oxide.

For example, as shown in FIG. 1, the touch substrate 100 further includes: a grounded line 190 located on a side of the bridge line 150 away from the touch region 101.

In some examples, as shown in FIG. 2, the bridge line 150 includes a bridge main portion 151 and first U-shaped bent portions 152 located at two ends of the bridge main portion 151; each of the first U-shaped bent portions 152 is connected to the first sub portion 1321 or the second sub portion 1322. The first U-shaped bent portion 152 includes a first bent portion 1521 extending substantially along the second direction, a second bent portion 1522 extending substantially along the second direction, and a first connection portion 1523 extending substantially along the first direction and connecting the first bent portion 1521 with the second bent portion 1522, and the first bent portion 1521 is connected to the first sub portion 1321 or the second sub portion 1322. In other words, the portion of the bridge line 150 that is electrically connected to the first sub portion 1321 or the second sub portion 1322 is the first U-shaped bent portion 152. The first bent portion 1521 can enhance the connection stability of the bridge line 150 and the first sub portion 1321 or the second sub portion 1322 and reduce the connection resistance. It should be noted that the "extending substantially in the second direction" includes the case of strictly extending in the second direction, and also includes the case where the angle between the extending direction and the second direction is less than or equal to 45 degrees.

In some examples, as shown in FIG. 1 and FIG. 2, an orthographic projection of the first bent portion 152 on the base substrate 110 at least partially overlaps with an orthographic projection of the first sub portion 1321 or the second sub portion 1322 on the base substrate 110.

In some examples, as shown in FIG. 1 and FIG. 2, two first U-shaped bent portions 152 located at two ends of the bridge line 150 are axially symmetric with respect to a perpendicular bisector of the bridge line 150. For example, as shown in FIG. 2, the first sub portion 1321 or the second sub portion 1322 of the second disconnection touch electrode 132 is in a different layer from the first bent portion 1521. An insulating layer (not shown in FIG. 2) may be provided between the first sub portion 1321 or the second sub portion 1322 and the first bent portion 1521. In this case, the first sub portion 1321 or the second sub portion 1322 may be electrically connected to the first bent portion 1521 by a through-hole connection structure 180. It should be noted that the through-hole connection structure 180 may include a through-hole in the insulating layer and a conductive structure in the through-hole. The embodiments of the present disclosure do not limit the specific structure of the through-hole connection structure.

In some examples, as shown in FIG. 2, the second bent portion 1522 connected to the bridge main portion 151 may include two portions that are respectively located in the first conductive layer and the second conductive layer and are electrically connected with each other. Similarly, the bridge main portion 151 also includes two portions that are respectively located in the first conductive layer and the second conductive layer and are electrically connected with each other, that is, the bridge main portion 151 may have a double-layer structure.

In some examples, as shown in FIG. 2, in the case where the bridge line 150 includes the first U-shaped bent portion 152, the shielding line 160 includes a shielding main portion 161 and second U-shaped bent portions 162 located at two ends of the shield main portion 161. The second U-shaped bent portion 162 includes a third bent portion 1621 extending substantially along the second direction, a fourth bent portion 1622 extending substantially along the second direction, and a second connection portion 1623 extending substantially along the first direction and connecting the fourth bent portion 1622 with the fourth bent portion 1622. The second U-shaped bent portion 162 is located in a region enclosed by the first bent portion 1521, the second bent portion 1522 and the first connection portion 1523. The first connection portion 1523 and the second connection portion 1623 are substantially parallel. An opening direction of the second U-shaped bent portion 162 and an opening direction of the first U-shaped bent portion 152 are the same. Therefore, in the case where the bridge line 150 includes the first U-shaped bent portion 152, the shielding line 160 provided with the second U-shaped bent portion 162 can better prevent the signal interference between the bridge line and the touch-driving connection line, so as to avoid affecting the touch performance.

In some examples, as shown in FIG. 2, because the touch-driving connection line 140 extends along the edge 1021 of the notch region 102 close to the touch region 101 and extends to the edge 1022 of the notch region 102 away from the touch region 101, the touch-driving connection line 140 overlaps with the first U-shaped bent portion 152. In this case, in the region enclosed by the first U-shaped bent portion 152, an orthographic projection of the touch-driving connection line 140 on the base substrate 110 is between an orthographic projection of the third bent portion 1621 on the base substrate 110 and an orthographic projection of the fourth bent portion 1622 on the base substrate 110 and overlaps with orthographic projections of the first connection portion 1523 and the second connection portion 1623 on the base substrate 110. In this case, the third bent portion 1621 of the shielding line 160 can better prevent signal interference between the touch-driving connection line 140 and the first bent portion 1521 of the bridge line 150, and the fourth bent portion 1622 of the shielding line 160 can better prevent signal interference between the touch-driving connection line 140 and the second bent portion 1522 of the bridge line 150.

In some examples, as shown in FIG. 2, in the overlapping region of the touch-driving connection line 140 and the first U-shaped bent portion 152 and the second U-shaped bent portion 162, the touch-driving connection line 140 includes a first sub touch-driving connection line 141 and a second sub touch-driving connection line 142 on two sides of the whole composed of the first connection portion 1523 and the second connection portion 1623; for example, as shown in FIG. 2, the touch-driving connection line 140 includes a first sub touch-driving connection line 141 located on a side of the second connection portion 1623 away from the first connection portion 1523 and a second sub touch-driving connection line 142 located on a side of the first connection portion 1523 away from the second connection portion 1623. The touch substrate 100 includes a bridge portion 143 connecting the first sub touch-driving connection line 141 with the second sub touch-driving connection line 142. Thus, by providing the bridge portion 143, the touch-driving connection line 140 can pass through the first connection portion 1523 and the second connection portion 1623, and can effectively prevent signal interference of the first connection portion 1523 and the second connection portion 1623 to the touch-driving connection line 140.

In some examples, as shown in FIG. 2, the shielding line 160 further includes an L-shaped bent portion 164 located on a side of the first connection portion 1523 away from the second connection portion 1623. The L-shaped bent portion 164 includes a first extension portion 1641 extending substantially along the first direction and a second extension portion 1642 connected to the first extension portion 1641 and extending substantially along the second direction, the first sub touch-driving connection line 141 is located on a side of the second connection portion 1623 away from the first connection portion 1523, the first extension portion 1641 is located between the first connection portion 1523 and the second sub touch-driving connection line 142, and the second extension portion 1642 is substantially parallel to the second sub touch-driving connection line 142. Therefore, the L-shaped bent portion 164 can effectively prevent the signal interference between the second sub touch-driving connection line 142 of the touch-driving connection line 140 and the bridge line 150.

Figure 3:
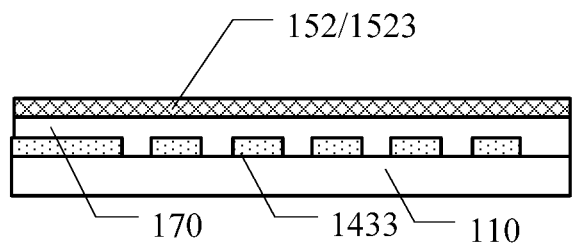
FIG. 3 is a cross-sectional diagram of a touch substrate provided by an embodiment of the present disclosure taken along an AA direction in FIG. 2.
Figure 4:
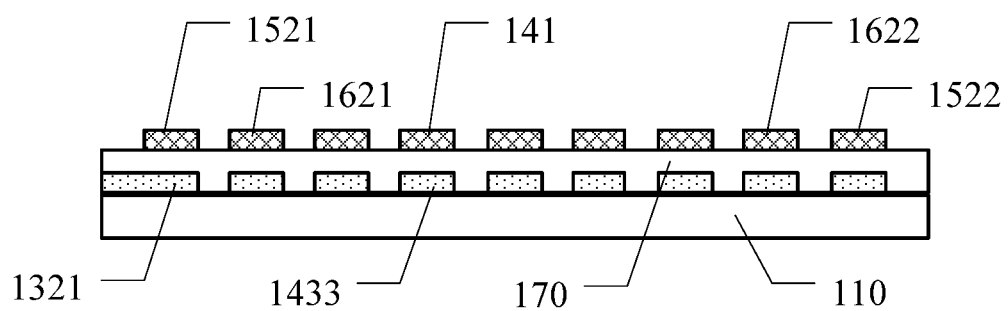
FIG. 4 is a cross-sectional diagram of a touch substrate provided by an embodiment of the present disclosure taken along a BB direction in FIG. 2.

FIG. 3 is a cross-sectional diagram of a touch substrate provided by an embodiment of the present disclosure taken along an AA direction in FIG. 2; and FIG. 4 is a cross-sectional diagram of a touch substrate provided by an embodiment of the present disclosure taken along a BB direction in FIG. 2. As shown in FIG. 2, FIG. 3 and FIG. 4, the first connecting portion 1523 and the second connecting portion 1623 may be arranged in the same layer. The bridge portion 143 includes a first through-hole connection portion 1431, a second through-hole connection portion 1432, and a third connection portion 1433; the third connection portion 1433 is arranged in a different layer from the first connection portion 1523, the second connection portion 1623, the first sub touch-driving connection line 141 and the second sub touch-driving connection line 142, the first through-hole connection portion 1431 connects the third connection portion 1433 with the first sub touch-driving connection line 141, and the second through-hole connection portion 1432 connects the third connection portion 1433 with the second sub touch-driving connection line 142. An insulating layer 170 is provided between the third connection portion 1433 and the first connection portion 1523. Because of the insulating effect of the insulating layer 170, the parasitic capacitance formed between the third connection portion 1433 and the first connection portion 1523 is small, so that the signal interference between the third connection portion 1433 and the first connection portion 1523 is weaker, which causes small effect on the touch effect.

In some examples, as shown in FIG. 2, FIG. 3, and FIG. 4, the third connection portion 1433 is located in the first conductive layer, that is, the third connection portion 1433 is a part of the first conductive layer, and the first sub touch-driving connection line 141 and the second sub touch-driving connection line 142 are located in the second conductive layer, that is, the first sub touch-driving connection line 141 and the second sub touch-driving connection line 142 are parts of the second conductive layer. An insulating layer 170 is provided between the first conductive layer and the second conductive layer, and the first through-hole connection portion 1431 and the second through-hole connection portion 1432 are provided in the insulating layer 170.

In some examples, as shown in FIG. 2, FIG. 3, and FIG. 4, an orthographic projection of the third connection portion 1433 on the base substrate 110 overlaps with an orthographic projection of the first sub touch-driving connection line 141 on the base substrate 110 and an orthographic projection of the second sub touch-driving connection line 142 on the base substrate 110, respectively.

In some examples, as shown in FIG. 2, FIG. 3, and FIG. 4, the shielding line 160 further includes: a fourth connection portion 168 provided in the same layer as the third connection portion 1433, a third through-hole connection portion 183 connecting the fourth connection portion 168 with the fourth bent portion 1622, and a fourth through-hole connection portion 184 connecting the fourth connection portion 168 with the second extension portion 1642. The fourth connection portion 168 is located in the first conductive layer, and the third bent portion 1621, the second connection portion 1623, the fourth bent portion 1622, the first extension portion 1641 and the second extension portion 1642 are located in the second conductive layer, and the third through-hole connection portion 183 and the fourth through-hole connection portion 184 are provided in the insulating layer.

In some examples, as shown in FIG. 2, FIG. 3, and FIG. 4, a center of the first through-hole connection portion 1431 and a center of the third through-hole connection portion 183 are staggered in the second direction, that is, an orthographic projection of the center of the first through-hole connection portion 1431 in the second direction does not overlap with an orthographic projection of the center of the third through-hole connection portion 183 in the second direction. Thus, when forming the second through-hole connection portion and the third through-hole connection portion described above, various defects caused by the punching position of the second through-hole connection portion and the punching position of the third through-hole connection portion being close can be avoided.

In some examples, as shown in FIG. 2, FIG. 3, and FIG. 4, an orthographic projection of the fourth connection portion 168 on the base substrate 110 overlaps with an orthographic projection of the fourth bent portion 1622 on the base substrate 110 and an orthographic projection of the second extension portion 1642 on the base substrate 110, respectively.

In some examples, as shown in FIG. 2, FIG. 3 and FIG. 4, the first bent portion 1521, the second bent portion 1522 and the first connection portion 1523 are located in the second conductive layer.

For example, as shown in FIG. 4, in the touch substrate, the second disconnection touch electrode 132 may be formed by a conductive layer, that is, the second touch electrode 130 may be formed by a conductive layer; and the first U-shaped bent portion 152 and the second U-shaped bent portion 162 may be formed by another conductive layer. In this case, the bridge line 150 may include a sub-bridge line 156 located on a side of the first connection portion 1523 away from the second connection portion 1623. The sub-bridge line 156 and the second disconnection touch electrode 132 are arranged in the same layer, and an orthographic projection of the sub-bridge line 156 on the base substrate 110 at least partially overlap with an orthographic projection of the second bent portion 1522 on the base substrate 110, and the sub-bridge line 156 and the second bent portion 1522 are electrically connected by the through-hole connection structure 180, thereby reducing the resistance of the bridge line 150. Similarly, the shielding line 160 includes a first sub-bridge line 166 and a second sub-bridge line 168 located on a side of the first connection portion 1523 away from the second connection portion 1623, the first sub-bridge line 166, the second sub-bridge line 168 and the second disconnection touch electrode 132 are arranged in the same layer. An orthographic projection of the first sub-bridge line 166 on the base substrate 110 at least partially overlaps with an orthographic projection of the third bent portion 1621 on the base substrate 110, and the first sub-bridge line 166 and the third bent portion 1621 are electrically connected by the through-hole connection structure 180, thereby reducing the resistance of the shielding line 160. An orthographic projection of the second sub-bridge line 168 on the base substrate 110 at least partially overlaps with an orthographic projection of the fourth bent portion 1622 on the base substrate 110, and the second sub-bridge line 168 and the fourth bent portion 1622 are connected by the through-hole connection structure 180, so that the resistance of the shielding line 160 can be reduced. It should be noted that the second sub-bridge line 168 may be a part of the fourth connection portion 168. It should be noted that the centers of all the through-hole connection structures may be staggered in the second direction, so as to avoid various defects caused by the close punching positions.

For example, as shown in FIG. 4, in the touch substrate, the second disconnection touch electrode 132 may be formed by the first conductive layer close to the base substrate 110, and the first U-shaped bent portion 152 and the second U-shaped bent portion 162 may be formed by the second conductive layer on a side of the first conductive layer away from the base substrate 110. In other words, the first U-shaped bent portion 152 and the second U-shaped bent portion 162 are located on a side of the second disconnection touch electrode 132 away from the base substrate. However, the embodiments of the present disclosure include but are not limited thereto. The first U-shaped bent portion 152 and the second U-shaped bent portion 162 may also be located on a side of the second disconnection touch electrode 132 close to the base substrate.

In some examples, the base substrate 110 is a cover plate of a display panel or an encapsulation layer of a display panel. In other words, the touch substrate can be integrated on a display panel, thereby having both the touch function and the display function.

For example, in the case where the display panel is an organic light emitting diode (OLED) display panel, the base substrate may be a cover plate or an encapsulation layer of the display panel.

Figure 5:
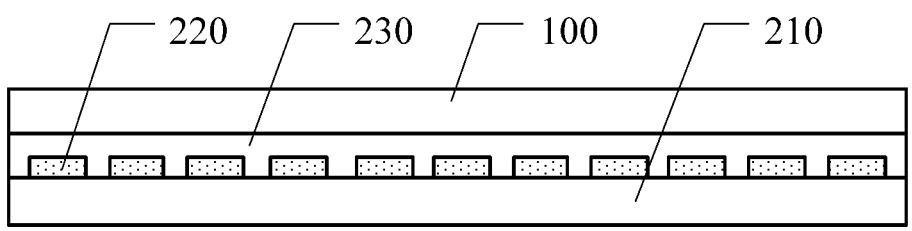
FIG. 5 is a schematic diagram of a touch display device provided by an embodiment of the present disclosure.

An embodiment of the present disclosure further provides a touch display device. FIG. 5 is a schematic diagram of a touch display device provided by an embodiment of the present disclosure. As shown in FIG. 5, the touch display device 200 includes the above touch substrate 100. Therefore, the display device has the same or similar beneficial technical effects as the above organic light emitting diode display substrate. For details, please refer to the related descriptions of the embodiment shown in FIG. 1 and FIG. 2, which will not be repeated here.

In some examples, the touch display device 200 further includes a substrate 210, a light emitting element 220 on the substrate 210, and an encapsulation layer 230 on a side of the light emitting element 220 away from the substrate 210. The above touch substrate 100 is directly disposed on the encapsulation layer 230, so that the thickness of the touch display device can be reduced, and the touch display device can be made lighter and thinner. On the other hand, directly disposing the above touch substrate on the encapsulation layer can also make the touch display device applicable to a foldable and bendable electronic product.

For example, the light emitting element 220 may be an organic light emitting diode (OLED) light emitting element.

In some examples, the notch region 102 is provided with one or more selected from the group consisting of a camera, a speaker, and an infrared sensor, so that the touch display device can achieve a larger screen ratio.

In some examples, the display device may be an electronic product with a display function such as a mobile phone, a notebook computer, a tablet computer, a navigator, an electronic photo frame, or the like.

Figure 6:
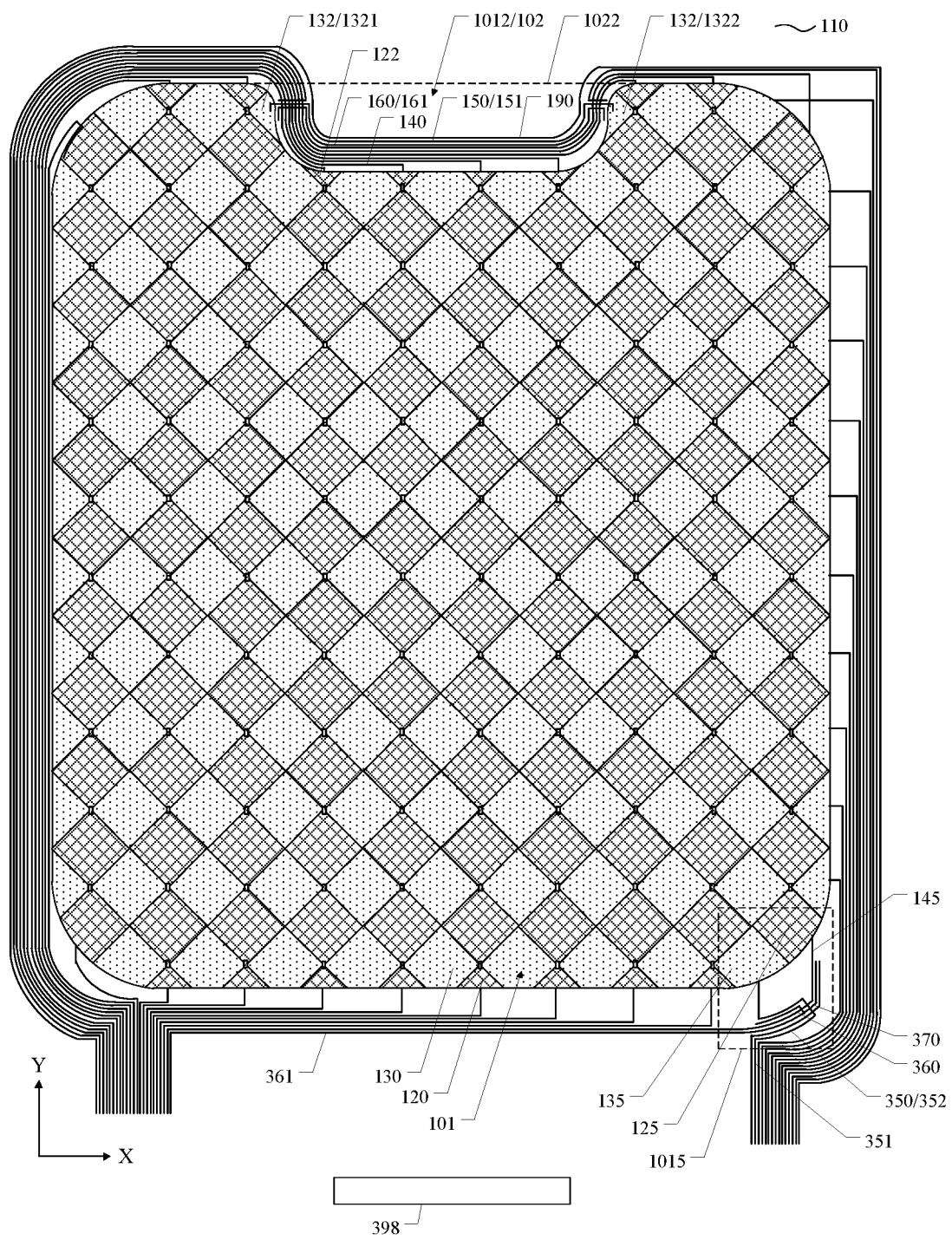
FIG. 6 is a planar diagram of another touch substrate provided by an embodiment of the present disclosure.
Figure 7:
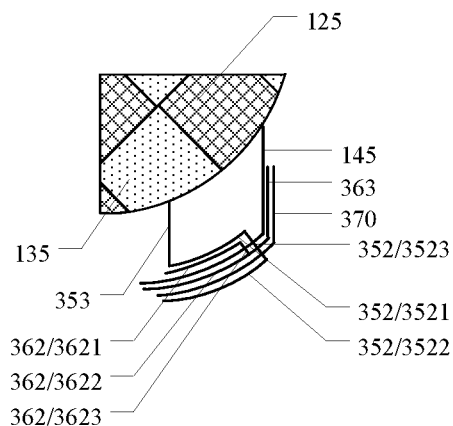
FIG. 7 is an enlarged diagram of a touch substrate provided by an embodiment of the present disclosure in a dashed frame in FIG. 6.

FIG. 6 is a planar diagram of another touch substrate provided by an embodiment of the present disclosure; FIG. 7 is an enlarged diagram of a touch substrate provided by an embodiment of the present disclosure in a dashed frame in FIG. 6; and FIG. 8 is an enlarged diagram of another touch substrate provided by an embodiment of the present disclosure in a dashed frame in FIG. 6.

Figure 8:
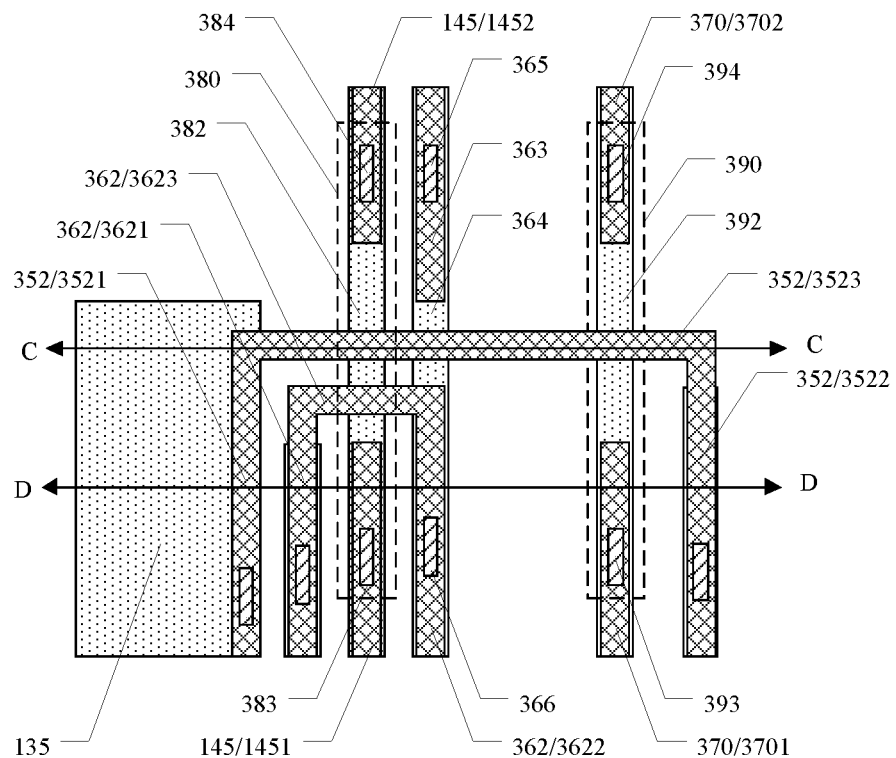
FIG. 8 is an enlarged diagram of another touch substrate provided by an embodiment of the present disclosure in a dashed frame in FIG. 6.

As shown in FIG. 6, FIG. 7 and FIG. 8, the touch substrate 300 includes a base substrate 110 and a plurality of first touch electrodes 120 and a plurality of second touch electrodes 130 on the base substrate 110. The plurality of first touch electrodes 120 are arranged along a first direction X; and the plurality of second touch electrodes 130 are arranged along a second direction Y The touch substrate 100 includes a touch region 101 and a peripheral region 105, the touch region 101 includes a rounded corner region 1015, and the plurality of first touch electrodes 120 include at least one first rounded corner touch electrode 125 extending to the rounded corner region 1015. The touch substrate 100 further includes a touch-driving connection line 145 connected to each of the at least one first rounded corner touch electrode 125. The plurality of second touch electrodes 130 include at least one second rounded corner touch electrode 135 extending to the rounded corner region 1015, and the touch substrate 100 further includes a touch-sensing connection line 350 connected to each of the at least one second rounded corner touch electrode 135. The touch-sensing connection line 350 includes a first U-shaped bent portion 352 and a first extension portion 351 extending along the second direction, and the first U-shaped bent portion 352 includes a first bent portion 3521 connected to the second rounded corner touch electrode 135 and on a side of the touch-driving connection line 145 close to the touch region 101, a second bent portion 3522 connected to the first extension portion 351 and on a side of the touch-driving connection line 145 away from the touch region 101, and a first connection portion 3523 connecting the first bent portion 3521 with the second bent portion 3522. The first connection portion 3523 and the touch-driving connection line 145 are overlapped with each other, and in an overlapping region of first connection portion 3523 and the touch-driving connection line 145, the first connection portion 3523 and the touch-driving connection line 145 are arranged in different layers. It should be noted that the above first touch electrode is a touch-driving electrode, and the above second touch electrode is a touch-sensing electrode; of course, the embodiments of the present disclosure include but are not limited to this case, the above first touch electrode may also be a touch-sensing electrode, and the above second touch electrode may also be a touch-driving electrode. Each first touch electrode is a touch electrode extending along the second direction, and the plurality of first touch electrodes are arranged along the first direction; each second touch electrode is a touch electrode extending along the first direction, and the plurality of second touch electrodes are arranged along the second direction. In addition, the above first direction and the second direction are two directions located in a plane where the touch substrate is located and intersecting each other, for example, perpendicular to each other.

In the touch substrate provided by the embodiments of the present disclosure, the touch-sensing connection line includes a first U-shaped bent portion and a first extension portion extending substantially along the second direction, and the first U-shaped bent portion includes a first bent portion, a second bent portion and a first connection portion that is arranged in a different layer from the touch-driving connection line, so that the second rounded corner touch electrode extending to the rounded corner region can be connected to the first extension portion of the corresponding touch-sensing connection line by the jumper line design in the rounded corner region.

For example, as shown in FIG. 6, the touch region 101 may be in a rectangle shape with rounded corners, and four corners of the touch region 101 are all rounded corner regions 1015. Of course, the embodiments of the present disclosure include but are not limited thereto, as long as the touch region includes at least one rounded corner region.

For example, as shown in FIG. 6, the first touch electrode 120 and the second touch electrode 130 may be made of the same conductive layer. For example, the second touch electrode 130 may be a continuous electrode extending along the first direction, and the first touch electrode 120 may include a plurality of block electrodes separated by the second touch electrode 130 and a plurality of electrode bridge structures connecting the plurality of block electrodes. Of course, the embodiments of the present disclosure include but are not limited thereto, and the layout of the first touch electrode and the second touch electrode can refer to the conventional design.

For example, the first touch electrode 120 and the second touch electrode 130 may be made of a metal material, or a conductive metal oxide such as indium tin oxide.

For example, as shown in FIG. 6, the touch substrate 100 further includes a grounded line 190 located on a side of the touch-sensing connection line 350 away from the touch-driving connection line 145 away from the touch region 101.

For example, as shown in FIG. 6, the touch substrate 100 further includes a bonding region 398, and the rounded corner region 1015 is located at a corner of the touch region 101 close to the bonding region 398.

In some examples, as shown in FIG. 6, FIG. 7 and FIG. 8, the first bent portion 3521 is substantially parallel to the outer edge of the rounded corner region 1015, and the second bent portion 3522 is also substantially parallel to the outer edge of the rounded corner region 1015.

In some examples, as shown in FIG. 6 and FIG. 7, the first bent portion 3521 of the touch-sensing connection line 350 and the rounded corner region 1015 are spaced apart from each other, the touch-sensing connection line 350 may further include an interconnection portion 353, the interconnection portion 353 electrically connects the first bent portion 3521 of the touch-sensing connection line 350 with the second rounded corner touch electrode 135. Of course, the embodiments of the present disclosure include but are not limited thereto. As shown in FIG. 8, the touch-sensing connection line may not be provided with the interconnection portion, and the first bent portion 3521 is directly connected to the second rounded corner touch electrode 135. In this case, an orthographic projection of the first bent portion 3521 of the touch-sensing connection line 350 on the base substrate 110 at least partially overlaps with an orthographic projection of the second rounded corner touch electrode 135 on the base substrate 110.

In some examples, as shown in FIG. 6, FIG. 7 and FIG. 8, the touch substrate 100 further includes a first shielding line 360, and the first shielding line 360 includes a second extension 361 and a second U-shaped bent portion 362. The second U-shaped bent portion 362 includes a third bent portion 3621 located between the first bent portion 3521 and the touch-driving connection line 145, a fourth bent portion 3622 located on a side of the touch-driving connection line 145 away from the first bent portion 3521, and a second connection portion 3623 connecting the third bent portion 3621 with the fourth bent portion 3622, the second connection portion 3623 overlaps with the touch-driving connection line 145 and is insulated from the touch-driving connection line 145. The second U-shaped bent portion 362 is located in a region enclosed by the first bent portion 3521, the second bent portion 3522 and the first connection portion 3523 of the first U-shaped bent portion 352. The first connection portion 3523 and the second connection portion 3623 are substantially parallel to each other, and an opening direction of the second U-shaped bent portion 362 is the same as an opening direction of the first U-shaped bent portion 352.

The touch substrate provided in this example can prevent signal interference between the touch-sensing connection line and the touch-driving connection line by providing the above first shielding line, thereby avoiding affecting the touch performance. In addition, because the above first shielding line includes the second U-shaped bent portion located in the region enclosed by the first bent portion, the second bent portion, and the first connection portion of the first U-shaped bent portion, thereby better preventing signal interference between the touch-sensing connection line and the touch-driving connection line, so as to avoid affecting the touch performance.

For example, as shown in FIG. 6, the second extension 361 extends substantially along the first direction and is located on a side of the touch-driving connection line 145 away from the touch region 101, thereby preventing external static electricity or electrical signals from interfering with the touch-driving connection line 145.

In some examples, as shown in FIG. 6 and FIG. 7, the touch substrate further includes a second shielding line 370. An orthographic projection of the second shielding line 370 on the base substrate 110 is located between an orthographic projection of the first shielding line 360 on the base substrate and an orthographic projection of the second bent portion 3522 of the touch-sensing connection line 350 on the base substrate 110. Therefore, the second shielding line can prevent signal interference between the touch-sensing connection line and the external touch-sensing connection line.

In some examples, as shown in FIG. 6 and FIG. 7, in the region enclosed by the first U-shaped bent portion 352, an orthographic projection of the touch-driving connection line 145 on the base substrate 110 is located between an orthographic projection of the third bent portion 3621 on the base substrate 110 and an orthographic projection of the fourth bent portion 3622 on the base substrate 110. Therefore, the first shielding line can better prevent signal interference between the touch-sensing connection line and the touch-driving connection line, and avoiding the signal interference between the touch-sensing connection line and the touch-driving connection line from affecting the touch performance.

In some examples, as shown in FIG. 6 and FIG. 7, in the region enclosed by the first U-shaped bent portion 352, the touch-driving connection line 145 includes a first sub touch-driving connection line 1451 on a side of the second connection portion 3623 away from the first connection portion 3523 and a second sub touch-driving connection line 1452 located on a side of the first connection portion 3523 away from the second connection portion 3623. The touch substrate 100 further includes a bridge portion 380 connecting the first sub touch-driving connection line with the second sub touch-driving connection line 1452. Thus, by providing the bridge portion 380, the touch-driving connection line 145 can pass through the first connection portion 3523 of the first U-shaped bent portion 352 and the second connection portion 3623 of the second U-shaped bent portion 362, and can effectively prevents the signal interference of the first connection portion 3523 and the second connection portion 3623 to the touch-driving connection line 140.

Figure 9:
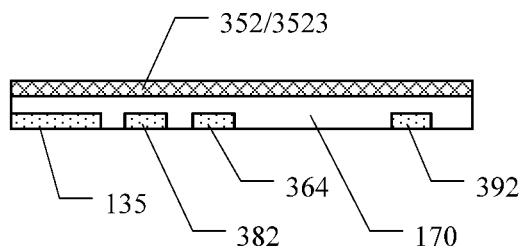
FIG. 9 is a cross-sectional diagram of a touch substrate provided by an embodiment of the present disclosure taken along a CC direction in FIG. 8.
Figure 10:
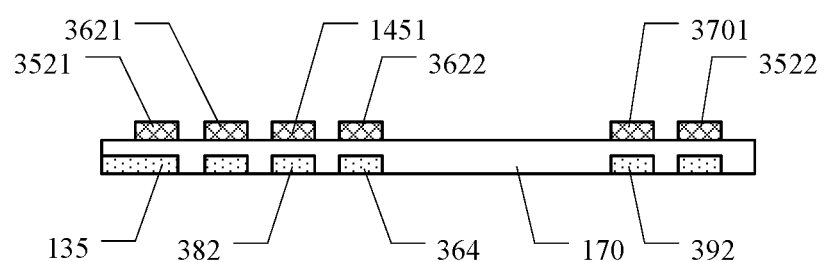
FIG. 10 is a cross-sectional diagram of a touch substrate provided by an embodiment of the present disclosure taken along a DD direction in FIG. 8.

FIG. 9 is a cross-sectional diagram of a touch substrate provided by an embodiment of the present disclosure taken along a CC direction in FIG. 8; and FIG. 10 is a cross-sectional diagram of a touch substrate provided by an embodiment of the present disclosure taken along a DD direction in FIG. 8.

In some examples, as shown in FIG. 8, FIG. 9 and FIG. 10, the first shielding line 360 further includes: a third extension portion 363 extending substantially along the second direction, a third connection portion 364 in different layer from the first connection portion 3523, a first through-hole connection portion 365 connecting the third connection portion 364 with the third extension portion 363, and a second through-hole connection portion 366 connecting the third connection portion 364 with the fourth bent portion 3622. The third connection portion 364 is located in the first conductive layer, the third extension portion 363 and the fourth bent portion 3622 are located in the second conductive layer. An insulating layer 170 is provided between the first conductive layer and the second conductive layer, and the first through-hole connection portion 365 and the second through-hole connection portion 366 are provided in the insulating layer 170. Because of the insulating effect of the insulating layer 170, the parasitic capacitance formed between the third connection portion 364 and the first connection portion 3523 is relatively small, so that the signal interference between the third connection portion 364 and the first connection portion 3523 is weaker, which causes small effects on the touch effect.

In some examples, as shown in FIG. 8, FIG. 9 and FIG. 10, the bridge portion 380 includes: a fourth connection portion 382 in a different layer from the first connection portion 3523, a third through-hole connection portion 383 connecting the fourth connection portion 382 with the first sub touch-driving connection line 1451, and a fourth through-hole connection portion 384 connecting the fourth connection portion 382 with the second sub touch-driving connection line 1452. The fourth connection portion 382 is located in the first conductive layer, The first sub touch-driving connection line 1451 and the second sub touch-driving connection line 1452 are located in the second conductive layer, an insulating layer 170 is provided between the first conductive layer and the second conductive layer, and the third through-hole connection portion 383 and the fourth through-hole connection portion are provided in the insulating layer.

In some examples, as shown in FIG. 8, FIG. 9 and FIG. 10, an orthographic projection of the fourth connection portion 382 on the base substrate 110 overlaps with an orthographic projection of the first sub touch-driving connection line 1451 on the base substrate 110 and an orthographic projection of the second sub touch-driving connection line 1452 on the base substrate 110, respectively.

In some examples, as shown in FIG. 8, FIG. 9 and FIG. 10, a center of the second through-hole connection portion 366 and a center of the third through-hole connection portion 383 are staggered in the second direction, that is, an orthographic projection of the center of the second through-hole connection portion 366 in the second direction does not overlap with an orthographic projection of the center of the third through-hole connection portion 383 in the second direction. Thus, when forming the second through-hole connection portion and the third through-hole connection portion described above, various defects caused by the punching position of the second through-hole connection portion and the punching position of the third through-hole connection portion being close can be avoided.

In some examples, as shown in FIG. 8, FIG. 9 and FIG. 10, the third connection portion 364 is located in the first conductive layer, that is, the third connection portion 364 is a part of the first conductive layer. The first sub touch-driving connection line 1451 and the second sub touch-driving connection line 1452 are located in the second conductive layer, that is, the first sub touch-driving connection line 1451 and the second sub touch-driving connection line 1452 are parts of the second conductive layer. An insulating layer 170 is provided between the first conductive layer and the second conductive layer, and the first through-hole connection portion 365 and the second through-hole connection portion 366 are provided in the insulating layer 170.

In some examples, as shown in FIG. 8, FIG. 9 and FIG. 10, an orthographic projection of the third connection portion 364 on the base substrate 110 overlaps with an orthographic projection of the fourth bent portion 3622 on the base substrate 110 and an orthographic projection of the third extension portion 363 on the base substrate 110, respectively.

In some examples, as shown in FIG. 8, FIG. 9 and FIG. 10, the second shielding line 370 includes a first sub-shielding line 3701 on a side of the second connection portion 3623 away from the first connection portion 3523 and a second sub-shielding line 3702 on a side of the first connection portion 3523 away from the second connection portion 3623. The touch substrate 100 further includes a shielding line bridge portion 390 connecting the first sub-shielding line 3701 with the second sub-shielding line 3702. Thus, by providing the shielding line bridge portion 390, the second shielding line 370 can pass through the first connection portion 3523 of the first U-shaped bent portion 352 and the second connection portion 3623 of the second U-shaped bent portion 362, and can further prevent the signal interference of the second bent portion 3522 to the touch-driving connection line 140.

In some examples, as shown in FIG. 8, FIG. 9 and FIG. 10, the shielding line bridge portion 390 includes: a fifth connection portion 392 in a different layer from the first connection portion 3523, a fifth through-hole connection portion 393 connecting the fifth connection portion 392 with the first sub-shielding line 3701, and a sixth through-hole connection portion 394 connecting the fifth connection portion 392 with the second sub-shielding line 3702. The fifth connection portion 392 is located in the first conductive layer, and the first sub-shielding line 3701 and the second sub-shielding line 3702 are located in the second conductive layer. An insulating layer 170 is provided between the first conductive layer and the second conductive layer, and the fifth through-hole connection portion 393 and the sixth through-hole connection portion 394 is provided in the insulating layer.

Similarly, a center of the fifth through-hole connection portion 393, a center of the second through-hole connection portion 366, and a center of the third through-hole connection portion 383 are staggered in the second direction, that is, an orthographic projection of the center of the fifth through-hole connection portion 393 and an orthographic projection of the second through-hole connection portion 366 in the second direction do not overlap with an orthographic projection of the center of the third through-hole connection portion 383 in the second direction. Thus, when forming the second through-hole connection portion, the third through-hole connection portion, and the fifth through-hole connection portion, various defects caused by the punching position of the second through-hole connection portion, the punching position of the third through-hole connection portion and the punching position of the fifth through-hole connection portion being close can be avoided.

It should be noted that the first bent portion, the second bent portion and the touch-driving connection line may all include through-hole connection structures, and the centers of the through-hole connection structures may also be staggered to the center of the fifth through-hole connection portion, the center of the second through-hole connection portion and the center of the third through-hole connection portion in the second direction.

In some examples, as shown in FIG. 8, FIG. 9 and FIG. 10, an orthographic projection of the fifth connection portion 392 on the base substrate 110 overlaps with an orthographic projection of the first sub-shielding line 3701 on the base substrate 110 and an orthographic projection of the second sub-shielding line 3702 on the base substrate 110, respectively.

In some examples, the base substrate 110 is a cover plate of a display panel or an encapsulation layer of a display panel. In other words, the touch substrate can be integrated on a display panel, thereby having both the touch function and the display function.

For example, in the case where the display panel is an organic light emitting diode (OLED) display panel, the base substrate may be a cover plate or an encapsulation layer of the display panel.

Figure 11:
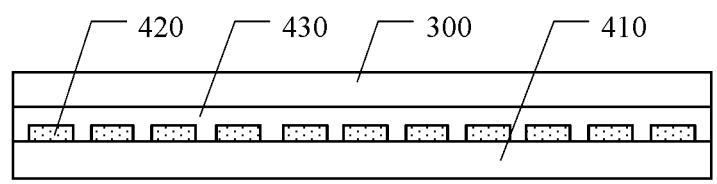
FIG. 11 is a schematic diagram of another touch display device provided by an embodiment of the present disclosure.

An embodiment of the present disclosure further provides a touch display device. FIG. 11 is a schematic diagram of a touch display device provided by an embodiment of the present disclosure. As shown in FIG. 11, the touch display device 400 includes the above touch substrate 300. Therefore, the display device has the same or similar beneficial technical effects as the above organic light emitting diode display substrate. For details, please refer to the related descriptions of the embodiment shown in FIG. 6, FIG. 7 and FIG. 8, which will not be repeated here.

In some examples, the touch display device 400 further includes a substrate 410, a light emitting element 420 on the substrate 210, and an encapsulation layer 430 on a side of the light emitting element 420 away from the substrate 410. The above touch substrate 300 is directly disposed on the encapsulation layer 430, so that the thickness of the touch display device can be reduced, and the touch display device can be made lighter and thinner. On the other hand, directly disposing the above touch substrate on the encapsulation layer can also make the touch display device applicable to a foldable and bendable electronic product.

For example, the light emitting element 420 may be an organic light emitting diode (OLED) light emitting element.

In some examples, the display device may be an electronic product with a display function such as a mobile phone, a notebook computer, a tablet computer, a navigator, an electronic photo frame, or the like.

The following statements should be noted.
(1) The accompanying drawings involve only the structure(s) in connection with the embodiment(s) of the present disclosure, and other structure(s) can be referred to common design(s).
(2) In case of no conflict, features in one embodiment or in different embodiments can be combined to obtain new embodiments.

What have been described above are only specific implementations of the present disclosure, the protection scope of the present disclosure is not limited thereto, and the protection scope of the present disclosure should be based on the protection scope of the claims.

What is claimed is:

1. A touch substrate, comprising:
a base substrate;
a plurality of first touch electrodes arranged along a first direction on the base substrate; and
a plurality of second touch electrodes arranged along a second direction on the base substrate,
wherein the touch substrate comprises a touch region and a notch region at an edge portion of the touch region in the second direction, the plurality of first touch electrodes comprise at least one first notch touch electrode adjacent to the notch region, the touch substrate further comprises a touch-driving connection line connected to the at least one first notch touch electrode, and the plurality of second touch electrodes comprise a plurality of second disconnection touch electrode disconnected at the notch region, each of the at least one second disconnection touch electrode comprises a first sub portion and a second sub portion respectively on two sides of the notch region in the first direction,
the touch substrate further comprises a bridge line, the bridge line at least partially extends along an edge of the notch region close to the touch region and connects the first sub portion with the second sub portion, at least one touch-driving connection line extends along the edge of the notch region close to the touch region, and
the touch substrate further comprises a shielding line, and an orthographic projection of at least a part of the shielding line on the base substrate is between an orthographic projection of the bridge line on the base substrate and an orthographic projection of the touch-driving connection line on the base substrate, is spaced apart from the orthographic projection of the bridge line on the base substrate and the orthographic projection of the touch-driving connection line on the base substrate, respectively,
the bridge line comprises a bridge main portion and a first bent portion, a second bent portion and a first connection potion located at each of two ends of the bridge main portion; the bridge main portion, the first bent portion and the second bent portion extend along the edge of the notch region close to the touch region, an extending direction of the first connection portion intersects with an extending direction of the first bent portion or the second bent portion, two ends of the first connection portion are respectively connected with the first bent portion and the second bent portion, and the second bent portion and the bridge main portion belong to one continuous wire.

2. The touch substrate according to claim 1, wherein an orthographic projection of the first bent portion on the base substrate at least partially overlaps with an orthographic projection of the first sub portion on the base substrate or an orthographic projection of the second sub portion on the base substrate.

3. The touch substrate according to claim 1, wherein a length of the first bent portion is larger than a length of the second bent portion.

4. The touch substrate according to claim 1, wherein two first bent portions and two first connection portions located at two ends of the bridge line are axially symmetric with respect to a perpendicular bisector of the bridge line, respectively.

5. The touch substrate according to claim 1, wherein the bridge main portion comprises two portions respectively in a first conductive layer and a second conductive layer and electrically connected with each other.

6. The touch substrate according to claim 5, wherein the shielding line comprises a shielding main portion and a third bent portion and a fourth bent portion located at each of two ends of the shielding main portion, the shielding main portion, the third bent portion and the fourth bent portion extend along the edge of the notch region close to the touch region, the fourth bent portion and the shielding main portion belong to a continuous wire;
the third bent portion is substantially parallel to the first bent portion, and located between the first bent portion and the touch-driving connection line, the fourth bent portion is substantially parallel to the second bent portion, and located between the second bent portion and the touch-driving connection line.

7. The touch substrate according to claim 6, wherein the shielding line further comprises a second connection portion, an extending direction of the second connection portion intersects with an extending direction of the third bent portion and the fourth bent portion; two ends of the second connection portion are respectively connected with the third bent portion and the fourth bent portion; the first connection portion is substantially parallel to the second connection portion, and located between the second connection portion and the touch-driving connection line.

8. The touch substrate according to claim 6, wherein at least part of an orthographic projection of the touch-driving connection line on the base substrate is between an orthographic projection of the third bent portion on the base substrate and an orthographic projection of the fourth bent portion on the base substrate, and overlaps with orthographic projections of the first connection portion and the second connection portion on the base substrate.

9. The touch substrate according to claim 8, wherein the touch-driving connection line comprises a first sub touch-driving connection line on a side of the second connection portion away from the first connection portion and a second sub touch-driving connection line on a side of the first connection portion away from the second connection portion, and the touch substrate further comprises a bridge portion connecting the first sub touch-driving connection line with the second sub touch-driving connection line.

10. The touch substrate according to claim 9, wherein the shielding line further comprises:
a first extension portion and a second extension portion located on a side of the first connection portion away from the second connection portion,
the first extension portion is between the first connection portion and the second sub touch-driving connection line, and the second extension portion is substantially parallel to the second sub touch-driving connection line, and located on a side of the second sub touch-driving connection line away from the touch region.

11. The touch substrate according to claim 9, wherein the bridge portion comprises:
a third connection portion, in a different layer from the first connection portion, the first sub touch-driving connection line and the second sub touch-driving connection line;
a first through-hole connection portion, connecting the third connection portion with the first sub touch-driving connection line; and
a second through-hole connection portion, connecting the third connection portion with the second sub touch-driving connection line,
wherein the third connection portion is in the first conductive layer, the first sub touch-driving connection line and the second sub touch-driving connection line are in the second conductive layer, an insulating layer is provided between the first conductive layer and the second conductive layer, and the first through-hole connection portion and the second through-hole connection portion are in the insulating layer,
an orthographic projection of the third connection portion on the base substrate overlaps with an orthographic projection of the first sub touch-driving connection line on the base substrate and an orthographic projection of the second sub touch-driving connection line on the base substrate, respectively.

12. The touch substrate according to claim 11, wherein the shielding line further comprises:
a fourth connection portion, in a same layer as the third connection portion;
a third through-hole connection portion, connecting the fourth connection portion with the fourth bent portion; and
a fourth through-hole connection portion, connecting the fourth connection portion with the second extension portion,
wherein the fourth connection portion is in the first conductive layer, the third bent portion, the second connection portion, the fourth bent portion, the first extension and the second extension portion are in the second conductive layer, and the third through-hole connection portion and the fourth through-hole connection portion are in the insulating layer, and an orthographic projection of the fourth connection portion on the base substrate overlaps with an orthographic projection of the fourth bent portion on the base substrate and an orthographic projection of the second extension portion on the base substrate, respectively.

13. The touch substrate according to claim 12, wherein a center of the first through-hole connection portion and a center of the third through-hole connection portion are staggered in the second direction.

14. The touch substrate according to claim 12, wherein the first bent portion, the second bent portion and the first connection portion are in the second conductive layer.

15. The touch substrate according to claim 1, further comprising:
a grounded line, on a side of the bridge line away from the touch region.

16. The touch substrate according to claim 1, wherein the base substrate is a cover plate of a display panel or an encapsulation layer of a display panel.

17. The touch substrate according to claim 1, wherein the first touch electrode is a touch-driving electrode, and the second touch electrode is a touch-sensing electrode.

18. A touch display device, comprising the touch substrate according to claim 1.

19. The touch display device according to claim 18, wherein the notch region is provided with one or more selected from the group consisting of a camera, a speaker and an infrared sensor.

* * * * *